(12) United States Patent
Yanagisawa et al.

(10) Patent No.: US 11,313,050 B2
(45) Date of Patent: Apr. 26, 2022

(54) INDIUM PHOSPHIDE SINGLE-CRYSTAL BODY AND INDIUM PHOSPHIDE SINGLE-CRYSTAL SUBSTRATE

(71) Applicant: Sumitomo Electric Industries, Ltd., Osaka (JP)

(72) Inventors: Takuya Yanagisawa, Osaka (JP); Kazuaki Konoike, Osaka (JP); Katsushi Hashio, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/335,405

(22) PCT Filed: Jul. 3, 2018

(86) PCT No.: PCT/JP2018/025272
§ 371 (c)(1),
(2) Date: Mar. 21, 2019

(87) PCT Pub. No.: WO2019/009306
PCT Pub. Date: Jan. 10, 2019

(65) Prior Publication Data
US 2020/0017992 A1 Jan. 16, 2020

(30) Foreign Application Priority Data
Jul. 4, 2017 (WO) ............. PCT/JP2017/024460

(51) Int. Cl.
*C30B 29/40* (2006.01)
*C30B 11/02* (2006.01)

(52) U.S. Cl.
CPC .............. *C30B 29/40* (2013.01); *C30B 11/02* (2013.01)

(58) Field of Classification Search
CPC ..................................................... C30B 29/40
See application file for complete search history.

(56) References Cited

U.S. PATENT DOCUMENTS 5,041,186 A * 8/1991 Nishio .................... C30B 15/20
117/15
2006/0260536 A1* 11/2006 Wachi .................... C30B 27/00
117/13

(Continued)

FOREIGN PATENT DOCUMENTS

CN 101230488 A 7/2008
JP H01-239089 A 9/1989

(Continued)

OTHER PUBLICATIONS

N. Bordes et al., "Analytical Possibilities of Medium Energy Tritium Beams (3 <E <12 MeV) and Application to the Analysis of Oxygen in InP," Nuclear Instruments and Methods in Physics Research Section B, vol. 24-25, Apr. 1, 1987, pp. 722-724.

(Continued)

*Primary Examiner* — William D Young
(74) *Attorney, Agent, or Firm* — Faegre Drinker Biddle & Reath LLP

(57) ABSTRACT

An indium phosphide single-crystal body has an oxygen concentration of less than $1\times10^{16}$ atoms·cm$^{-3}$, and includes a straight body portion having a cylindrical shape, wherein a diameter of the straight body portion is more than or equal to 100 mm and less than or equal to 150 mm or is more than 100 mm and less than or equal to 150 mm. An indium phosphide single-crystal substrate has an oxygen concentration of less than $1\times10^{16}$ atoms·cm$^{-13}$, wherein a diameter of the indium phosphide single-crystal substrate is more than or equal to 100 mm and less than or equal to 150 mm or is more than 100 mm and less than or equal to 150 mm.

6 Claims, 2 Drawing Sheets

(56) References Cited

U.S. PATENT DOCUMENTS

2007/0101924 A1* 5/2007 Kawase ............... C30B 29/40
117/2
2016/0053404 A1 2/2016 Young et al.

FOREIGN PATENT DOCUMENTS

| JP | 2002-114600 A | 4/2002 |
| JP | 2016-519642 A | 7/2016 |
| JP | 6439898 B1 | 12/2018 |

OTHER PUBLICATIONS

G. W. Blackmore et al., "Concentrations of Carbon and Oxygen in Indium Phosphide and Gallium Arsenide Crystals Grown by the LEC Technique," Journal of Electronic Materials, vol. 5, No. 4, Jan. 1, 1976, pp. 401-413.
T. Asahi et al., "Growth of 100-mm-Diameter (100) InP Single Crystals by the Vertical Gradient Freezing Method," Japanese Journal of Applied Physics, vol. 38, No. 2B, part 1, Feb. 1, 1999, pp. 977-980.

* cited by examiner

US 11,313,050 B2

INDIUM PHOSPHIDE SINGLE-CRYSTAL BODY AND INDIUM PHOSPHIDE SINGLE-CRYSTAL SUBSTRATE

TECHNICAL FIELD

The present invention relates to an indium phosphide single-crystal body and an indium phosphide single-crystal substrate. The present application claims a priority based on International Application PCT/JP2017/024460 filed on Jul. 4, 2017, the entire content of which is incorporated herein by reference.

BACKGROUND ART

A compound semiconductor substrate, such as an indium phosphide substrate, has been suitably used as a substrate of a semiconductor device. It has been required to develop a compound semiconductor substrate on which a high-quality epitaxial layer can be grown to form a semiconductor device having high characteristics.

Japanese Patent Laying-Open No. 2002-114600 (Patent Literature 1) discloses an InP (indium phosphide) single-crystal substrate having an oxygen atom concentration falling within a range of $1 \times 10^{17}$ atoms/cm$^3$ to $1 \times 10^{18}$ atoms/cm$^3$ in order to suppress occurrence of hillock (abnormal growth appearing on a surface of the epitaxial layer in the form of a protrusion; the same applies to the description below) in an epitaxial layer layered on the InP substrate.

Moreover, in order to form a semiconductor device having high characteristics by reducing an impurity element concentration of a substrate and growing a high-quality epitaxial layer thereon, Japanese National Patent Publication No. 2016-519642 (Patent Literature 2) discloses a group III-V semiconductor substrate containing oxygen, wherein the level of the oxygen concentration can be controlled by supplying a material having high chemical reactivity with oxygen, and the oxygen concentration is controlled to fall within a range of $1.2 \times 10^{16}$ to $6 \times 10^{17}$ atoms cm$^{-3}$.

CITATION LIST

Patent Literature

PTL 1: Japanese Patent Laying-Open No. 2002-114600
PTL 2: Japanese National Patent Publication No. 2016-519642

SUMMARY OF INVENTION

An indium phosphide single-crystal body according to the present disclosure has an oxygen concentration of less than $1 \times 10^{16}$ atoms·cm$^{-3}$, and includes a straight body portion having a cylindrical shape, wherein a diameter of the straight body portion is more than or equal to 100 mm and less than or equal to 150 mm or is more than 100 mm and less than or equal to 150 mm.

An indium phosphide single-crystal substrate according to the present disclosure has an oxygen concentration of less than $1 \times 10^{16}$ atoms·cm$^{-3}$, wherein a diameter of the indium phosphide single-crystal substrate is more than or equal to 100 mm and less than or equal to 150 mm or is more than 100 mm and less than or equal to 150 mm.

DETAILED DESCRIPTION

Figure 1:
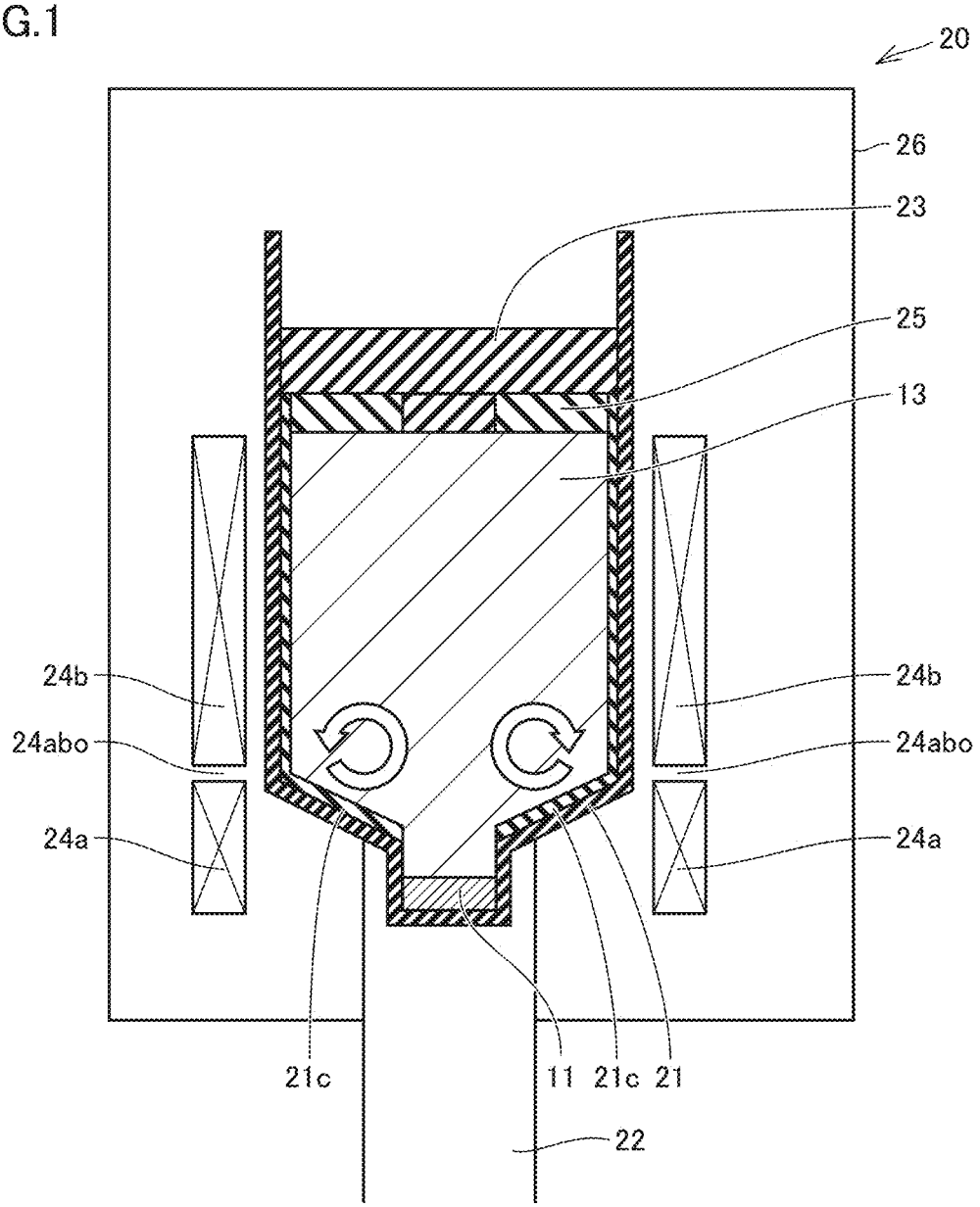
FIG. 1 is a schematic cross sectional view showing exemplary manufacturing method and manufacturing apparatus for an indium phosphide single-crystal body in the present disclosure.

Problem to be Solved by the Present Disclosure

Since the InP single-crystal substrate disclosed in Japanese Patent Laying-Open No. 2002-114600 (Patent Literature 1) has a comparatively high oxygen atom concentration falling within a range of $1 \times 10^{17}$ atoms/cm$^3$ to $1 \times 10^{18}$ atoms/cm$^3$, a naturally oxidized film is facilitated to be formed in a surface of the InP single-crystal substrate. Hence, when an epitaxial layer is grown on such a surface, an oxide layer having an insulating property is formed at an interface between the substrate and the epitaxial layer, thus resulting in a high resistance of a semiconductor device to be obtained, disadvantageously. Moreover, since the oxygen atom concentration in the InP single-crystal substrate is comparatively high, free electrons are highly likely to be trapped by a composite state formed by oxygen and other impurity elements, thus resulting in a low response speed of a semiconductor device including such an InP single-crystal substrate, disadvantageously.

Although the group III-V semiconductor substrate disclosed in Japanese National Patent Publication No. 2016-519642 (Patent Literature 2) is controlled to have a comparatively low oxygen concentration falling within a range of $1.2 \times 10^{16}$ to $6 \times 10^{17}$ atoms·cm$^{-3}$, this is still insufficient to solve the above-described problem.

Accordingly, in order to solve the above-described problem, an object of the present disclosure is to provide an indium phosphide single-crystal body and an indium phosphide single-crystal substrate, each of which has a very low oxygen concentration.

Advantageous Effect of the Present Disclosure

According to the present disclosure, there can be provided an indium phosphide single-crystal body and an indium phosphide single-crystal substrate, each of which has a very low oxygen concentration.

DESCRIPTION OF EMBODIMENTS

First, embodiments of the present invention are listed and described.

[1] An indium phosphide single-crystal body according to one embodiment of the present invention has an oxygen concentration of less than $1 \times 10^{16}$ atoms·cm$^{-3}$, and includes a straight body portion having a cylindrical shape, wherein a diameter of the straight body portion is more than or equal to 100 mm and less than or equal to 150 mm. In the indium phosphide single-crystal body according to the present embodiment, the oxygen concentration is very low even though the diameter of the straight body portion of the indium phosphide single-crystal body is so large as to be more than or equal to 100 mm and less than or equal to 150 mm.

[2] An indium phosphide single-crystal body according to one embodiment of the present invention has an oxygen concentration of less than $1 \times 10^{16}$ atoms·cm$^{-3}$, and includes a straight body portion having a cylindrical shape, wherein a diameter of the straight body portion is more than 100 mm and less than or equal to 150 mm. In the indium phosphide single-crystal body according to the present embodiment, the oxygen concentration is very low even though the diameter of the straight body portion of the indium phosphide single-crystal body is so large as to be more than 100 mm and less than or equal to 150 mm.

[3] An indium phosphide single-crystal substrate according to one embodiment of the present invention has an oxygen concentration of less than $1\times10^{16}$ atoms·cm$^{-3}$, wherein a diameter of the indium phosphide single-crystal substrate is more than or equal to 100 mm and less than or equal to 150 mm. In the indium phosphide single-crystal substrate according to the present embodiment, the oxygen concentration is very low even though the diameter of the indium phosphide single-crystal substrate is so large as to be more than or equal to 100 mm and less than or equal to 150 mm.

[4] An indium phosphide single-crystal substrate according to one embodiment of the present invention has an oxygen concentration of less than $1\times10^{16}$ atoms·cm$^{-3}$, wherein a diameter of the indium phosphide single-crystal substrate is more than 100 mm and less than or equal to 150 mm. In the indium phosphide single-crystal substrate according to the present embodiment, the oxygen concentration is very low even though the diameter of the indium phosphide single-crystal substrate is so large as to be more than 100 mm and less than or equal to 150 mm.

Details of Embodiments

First Embodiment: Indium Phosphide Single-Crystal Body

An InP (indium phosphide) single-crystal body of the present embodiment has an oxygen concentration of less than $1\times10^{16}$ atoms·cm$^{-3}$, and includes a straight body portion having a cylindrical shape, wherein a diameter of the straight body portion is more than or equal to 100 mm and less than or equal to 150 mm or is more than 100 mm and less than or equal to 150 mm. Although the diameter of the straight body portion of the InP single-crystal body of the present embodiment is so large as to be more than or equal to 100 mm and less than or equal to 150 mm or as to be more than 100 mm and less than or equal to 150 mm, the oxygen concentration of the InP single-crystal body is less than $1\times10^{16}$ atoms·cm$^{-3}$, which is very low. Accordingly, an oxide layer is suppressed from being formed in a surface of the InP single-crystal body and a composite state is suppressed from being formed in the InP single-crystal body, whereby a semiconductor device including the InP single-crystal body has high characteristics. The oxygen concentration of the InP single-crystal body is measured by SIMS (Secondary Ion Mass Spectrometry). Here, since an oxygen detection limit concentration in SIMS is about $1\times10^{16}$ atoms·cm$^3$, the oxygen concentration of the InP single-crystal body of the present embodiment is less than the detection limit in SIMS, and a precise oxygen concentration thereof is measured by CPAA (Charged Particle Activation Analysis) or the like. In order to improve the characteristics of the semiconductor device by reducing the oxygen concentration, the precise oxygen concentration of the InP single-crystal body of the present embodiment as obtained by the activation analysis such as CPAA is preferably less than or equal to $9.5\times10^{15}$ atoms·cm$^{-3}$, and is more preferably less than or equal to $5.5\times10^{15}$ atoms·cm$^{-3}$. Moreover, a lower oxygen concentration is more preferable. Although not particularly limited, the lower limit of the oxygen concentration is more than or equal to $5\times10^{14}$ atoms·cm$^{-3}$ in view of a current manufacturing technology level.

Since the InP single-crystal body of the present embodiment is often manufactured by, but not particularly limited to, a boat method such as a VB (Vertical Bridgman) method or a VGF (Vertical Gradient Freezing) method as described below, the InP single-crystal body includes a straight body portion having a cylindrical shape, and the diameter of the straight body portion is more than or equal to 100 mm and less than or equal to 150 mm. Even though the diameter of the straight body portion of the InP single-crystal body is so large as to be more than or equal to 100 mm and less than or equal to 150 mm, the oxygen concentration is very low. Accordingly, an oxide layer is suppressed from being formed in a surface of the InP single-crystal body and a composite state is suppressed from being formed in the InP single-crystal body, whereby a semiconductor device including the InP single-crystal body has high characteristics. In order to attain the low oxygen concentration even in the large-sized InP single-crystal body, the diameter of the straight body portion is more than or equal to 100 mm, is preferably more than 100 mm, and is more preferably more than or equal to 125 mm. For the same reason, the length of the straight body portion is preferably more than or equal to 70 mm, and is more preferably more than or equal to 100 mm.

Although not particularly limited, it is preferable that the InP single-crystal body of the present embodiment specifically has a shape including: a cylindrical small-diameter portion having a small diameter; a conical portion that is connected to the small-diameter portion and that has a gradually increasing diameter; and a cylindrical straight body portion that is connected to the conical portion and that has a diameter larger than the diameter of the small-diameter portion. Such a shape is suitably formed by the below-described boat method such as the VB method or the VGF method.

With reference to FIG. 1, although not particularly limited, a manufacturing apparatus 20 for the InP single-crystal body of the present embodiment preferably includes a crucible 21, a crucible holder 22, a sealing member 23, heaters 24a, 24b, a closure plate 25, and a chamber 26 in order to efficiently manufacture the InP single-crystal body having an oxygen concentration of less than $1\times10^{16}$ atoms·cm$^{-3}$.

Crucible 21 includes a seed crystal holding portion and a single-crystal growth portion connected onto the seed crystal holding portion. The seed crystal holding portion is a hollow cylindrical portion that opens at a side connected to the single-crystal growth portion and that is provided with a bottom wall at a side opposite thereto. At this portion, InP seed crystal 11 can be held. The single-crystal growth portion includes: a conical portion having a conical shape and connected to the seed crystal holding portion at the small-diameter side in the axial direction; and a hollow cylindrical straight body portion connected to the large-diameter side of the conical portion in the axial direction. The single-crystal growth portion has a function of holding an InP source material 13 therein and growing the InP single-crystal body by solidifying heated InP source material 13 in a molten state.

Here, a material of crucible 21 is not particularly limited as long as the material has a high mechanical strength and can withstand a temperature at which the source material is melted. For example, PBN (pyrolytic boron nitride) can be employed suitably therefor. Moreover, in order to avoid molten InP source material 13 from coming into direct contact with crucible 21, an oxide film 21c, such as a boron oxide film, is preferably formed on the inner wall surface of crucible 21 as a sealing member. Examples of the boron oxide film include a $B_2O_3$ film and the like. For example, the $B_2O_3$ film can be formed on the inner wall surface of crucible 21 by treating crucible 21, which is composed of PBN, at a high temperature of more than or equal to 1150° C. in an atmosphere containing more than or equal to 10 volume % of oxygen.

A material of sealing member 23 is not particularly limited as long as the material can withstand the temperature at which the source material is melted. A boron oxide, such as $B_2O_3$, can be employed suitably therefor.

The plurality of heaters 24a, 24b are normally placed to appropriately control the melting and solidification of InP source material 13; however, in order to reduce the oxygen concentration in the InP single-crystal body to be grown, a smaller number of inter-heater gaps are preferably provided. One inter-heater gap is preferably provided. That is, a smaller number of heaters are preferably provided. Two heaters are preferably provided.

Figure 2:
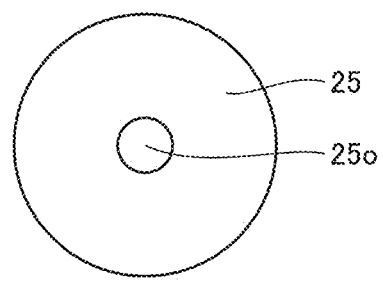
FIG. 2 is a schematic plan view showing an exemplary closure plate used in the manufacturing method and manufacturing apparatus for the indium phosphide single-crystal body in the present disclosure.

Closure plate 25 is preferably disposed between InP source material 13 and sealing member 23 in order to reduce the oxygen concentration in the InP single-crystal body to be grown. A material of closure plate 25 is not particularly limited as long as the material has a high mechanical strength and can withstand a temperature at which the source material is melted. For example, PBN (pyrolytic boron nitride) can be employed suitably therefor. A closure ratio (percentage of the area of the closure plate with respect to the cross sectional area of the straight body portion of crucible 21 perpendicular to the axial direction; the same applies to the description below) of closure plate 25 is preferably more than or equal to 85% and less than 100% and is more preferably more than or equal to 90% and less than or equal to 98% in order to reduce the oxygen concentration in the InP single-crystal to be grown and prevent breakage of the crucible. It should be noted that with reference to FIG. 2, closure plate 25 may be provided with an opening 25o for adjusting the closure ratio.

With reference to FIG. 1, although not particularly limited, in order to efficiently grow the InP single-crystal body having a low oxygen concentration, a method for manufacturing the InP single-crystal body in the present embodiment is preferably based on the boat method, such as the VB (Vertical Bridgman) method or the VGF (Vertical Gradient Freezing) method, using the above-described manufacturing apparatus 20. Specifically, the method for manufacturing the InP single-crystal body in the present embodiment preferably includes an InP seed crystal loading step, an InP source material loading step, a closure plate placing step, a sealing member placing step, and a single-crystal growing step.

First, manufacturing apparatus 20 is used to load InP seed crystal 11 in the seed crystal holding portion of crucible 21 in the InP seed crystal loading step. Next, in the InP source material loading step, InP source material 13 is loaded in the single-crystal growth portion (the conical portion and the straight body portion) of crucible 21. Here, the InP source material is not particularly limited as long as it is InP having high purity (for example, more than or equal to 99.9 mass %). An InP polycrystal body, an InP single-crystal body, or the like is used suitably therefor. Next, in the closure plate placing step, closure plate 25 is placed on InP source material 13 in crucible 21. Next, in the sealing member placing step, sealing member 23 is placed on closure plate 25 in crucible 21.

Next, in the single-crystal growing step, crucible 21 in which InP seed crystal 11, InP source material 13, closure plate 25, and sealing member 23 are disposed in this order from below to above is loaded in crystal apparatus 20. Crucible 21 is held by crucible holder 22, and heaters 24a, 24b are disposed to surround crucible 21. Next, crucible 21 is heated by supplying electric current to heaters 24a, 24b. Accordingly, InP source material 13 is melted into a melt and sealing member 23 is also melted into a liquid sealing member. Moreover, an oxide film is formed in the inner wall of crucible 21 due to oxidation of the material of crucible 21.

Figure 3:
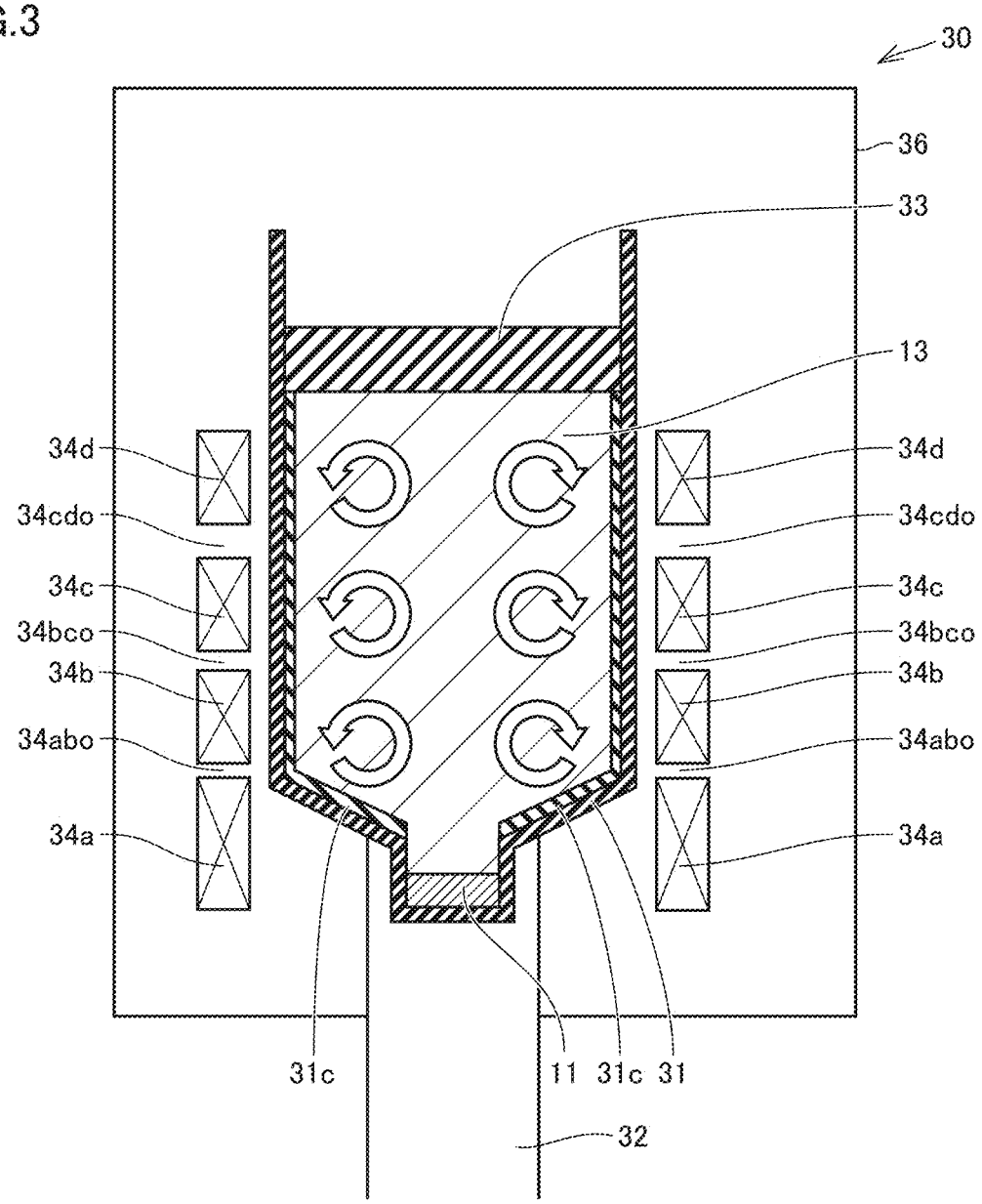
FIG. 3 is a schematic cross sectional view showing exemplary, typical manufacturing method and manufacturing apparatus for an indium phosphide single-crystal body.

On this occasion, the melt of the InP source material is stirred by convection currents generated due to local low-temperature portions formed by the presence of inter-heater gap 24abo between heater 24a and heater 24b. The stirred InP source material is brought into contact with oxide film 21c of the inner wall of crucible 21 and/or sealing member 23, whereby oxygen included in oxide film 21c of the inner wall of crucible 21 and/or sealing member 23 is presumably incorporated into the InP source material. Here, with reference to FIG. 3, in a typical manufacturing apparatus 30, three or more heaters 34a, 34b, 34c, 34d are disposed. Hence, there are two or more inter-heater gaps 34abo, 34bco, and 34cdo. Accordingly, many convection currents are generated by resultant local low-temperature portions, with the result that a large amount of oxygen included in oxide film 31c of the inner wall of crucible 31 and/or sealing member 33 is incorporated into the InP source material. On the other hand, with reference to FIG. 1, only two heaters 24a, 24b are disposed in manufacturing apparatus 20 of the present embodiment. Hence, there is only one inter-heater gap 24abo. Accordingly, fewer convection currents are generated by resultant local low-temperature portions, with the result that oxygen is suppressed from being incorporated into InP source material 13.

Further, in manufacturing apparatus 20 of the present embodiment, closure plate 25 is disposed between InP source material 13 and sealing member 23. Accordingly, contact between InP source material 13 and sealing member 23 is suppressed, with the result that oxygen is suppressed from being incorporated in InP source material 13.

Next, a temperature gradient in which a temperature at the InP seed crystal 11 side is relatively low and a temperature at the InP source material 13 side is relatively high in the axial direction of crucible 21 is formed by moving crucible 21 to the lower side in the axial direction in the case of the VB method or by adjusting the temperature of each of heaters 24a, 24b in the case of the VGF method. Accordingly, molten InP source material 13 is sequentially solidified from the InP seed crystal 11 side, whereby an InP single-crystal is grown. Molten InP source material 13 in the conical portion and straight body portion of the crystal growth portion is entirely solidified in this order, thereby forming the InP single crystal body. In the VB method, a moving speed (pulling-down speed) of crucible 21 is not particularly limited, and can be, for example, more than or equal to 2.0 mm/h and less than or equal to 5.0 mm/h.

It should be noted that in the method for manufacturing the InP single-crystal body in the present embodiment, as the diameter of the straight body portion of the grown crystal body becomes larger, a contact area between the InP source material and the sealing member is generally increased. Hence, the oxygen concentration in the InP crystal is more likely to be higher. Moreover, the large diameter of the crystal body leads to a large thermal stress during the crystal growth, with the result that a dislocation density of the crystal body tends to be high. In the gradual temperature distribution condition effective to suppress this, the temperature at the upper portion of the InP source material becomes low, with the result that stirring by convection currents is more likely to take place. That is, when an InP crystal body is grown to have a large diameter and a low dislocation density, an oxygen concentration in the InP crystal body becomes higher. According to the method for manufacturing the InP single-crystal body in the present embodiment, oxygen can be suppressed from being incorporated into the InP source material because the contact area between the source material and the sealing member is reduced by placing the closure plate and the convection currents are reduced by an appropriate heater structure and heat environmental design.

Second Embodiment: Indium Phosphide Single-Crystal Substrate

An InP (indium phosphide) single-crystal substrate of the present embodiment has an oxygen concentration of less than $1 \times 10^{16}$ atoms·cm$^{-3}$, wherein a diameter of the InP single-crystal substrate is more than or equal to 100 mm and less than or equal to 150 mm or is more than 100 mm and less than or equal to 150 mm. Even though the diameter of the InP single-crystal substrate of the present embodiment is so large as to be more than or equal to 100 mm and less than or equal to 150 mm or as to be more than 100 mm and less than or equal to 150 mm, the oxygen concentration is less than $1 \times 10^{16}$ atoms·cm$^{-3}$, which is very low. Accordingly, an oxide layer is suppressed from being formed in a surface of the InP single-crystal substrate and a composite state is suppressed from being formed in the InP single-crystal substrate, whereby a semiconductor device including the InP single-crystal substrate has high characteristics. The oxygen concentration of the InP single-crystal substrate is measured by SIMS (Secondary Ion Mass Spectrometry) as with the InP single-crystal body of the first embodiment. Here, the oxygen detection limit concentration in SIMS is about $1 \times 10^{16}$ atoms·cm$^{-3}$. Hence, the oxygen concentration of the InP single-crystal substrate of the present embodiment is less than the detection limit in SIMS, and a precise oxygen concentration thereof is measured by CPAA (Charged Particle Activation Analysis) or the like. In order to improve the characteristics of the semiconductor device by reducing the oxygen concentration, the precise oxygen concentration of the InP single-crystal substrate of the present embodiment as obtained by the activation analysis such as CPAA is preferably less than or equal to $9.5 \times 10^{15}$ atoms·cm$^{-3}$, and is more preferably less than or equal to $5.5 \times 10^{15}$ atoms·cm$^{-3}$. Moreover, a lower oxygen concentration is more preferable. The lower limit of the oxygen concentration is not particularly limited, but is more than or equal to $5 \times 10^{14}$ atoms·cm$^{-3}$ in view of a current manufacturing technology level.

The diameter of the InP single-crystal substrate of the present embodiment is more than or equal to 100 mm and less than or equal to 150 mm. Even though the diameter of the InP single-crystal substrate is so large as to be more than or equal to 100 mm and less than or equal to 150 mm, the oxygen concentration of the InP single-crystal substrate is very low. Accordingly, an oxide layer is suppressed from being formed in a surface of the InP single-crystal substrate and a composite state is suppressed from being formed in the InP single-crystal substrate, whereby a semiconductor device including the InP single-crystal substrate has high characteristics. The diameter of the InP single-crystal substrate is more than or equal to 100 mm, is preferably more than 100 mm, and is more preferably more than or equal to 125 mm in order to attain the low oxygen concentration even in the large-sized InP single-crystal substrate.

Although not particularly limited, a method for manufacturing the InP single-crystal substrate in the present embodiment preferably includes a processing step and a polishing step using the InP single-crystal body of the first embodiment in order to efficiently form an InP single-crystal substrate having an low oxygen concentration. In the processing step, the outer circumference of the InP single-crystal body is ground and the InP single-crystal body having been ground is sliced in an appropriately specified direction, thereby obtaining an InP single-crystal substrate having a main surface in the appropriately specified plane orientation. Next, in the polishing step, the main surface of the InP single-crystal substrate is subjected to mechanical polishing and/or chemical mechanical polishing (CMP), thereby obtaining an InP single-crystal substrate having a main surface polished to be a mirror surface.

EXAMPLES

Example 1

1. Production of InP Single-Crystal Body

An InP single-crystal body is grown by the VB method. As shown in FIG. 1, two heaters 24a, 24b are used and one inter-heater gap 24abo is provided. Closure plate 25 composed of PBN is placed between an InP polycrystal body having a purity of 99.9 mass % and serving as InP source material 13 and $B_2O_3$ serving as sealing member 23. The closure ratio (percentage of the area of the closure plate with respect to the cross sectional area of the straight body portion of crucible 21 perpendicular to the axial direction) of closure plate 25 is set to 97%. The InP single-crystal body is grown by adjusting a temperature distribution in the crucible to attain a temperature of 1065° C. at a surface of the InP source material and attain a temperature gradient of 2° C./cm at a crystal growth interface in a crystal growth direction.

2. Production of InP Single-Crystal Substrate

The outer circumference of the obtained InP single-crystal body was ground and the obtained InP single-crystal body was sliced along a plane perpendicular to the crystal growth direction. Then, the main surface thereof was subjected to mechanical polishing and chemical mechanical polishing (CMP), thereby producing InP single-crystal substrates each having a diameter of 100 mm and a thickness of 525 μm. The oxygen concentration of each of the obtained InP single-crystal substrates is measured by CPAA (Charged Particle Activation Analysis), the thickness of an oxide film formed in the main surface is measured by a spectral ellipsometer (PCA ellipsometer SE-101 provided by Photonic Lattice), and a dislocation density thereof is measured in an optical microscope image (BH2-UMA provided by Olympus). Further, emission intensities of oxygen defect centers in the InP crystal substrate are measured by a cathode luminescence measuring device (MonoCL4 provided by Gatan). Results are collectively shown in Table 1.

Here, in the CPAA for the oxygen concentration, $^{18}$F is used which is generated by a nuclear reaction between $^3$He and oxygen, $^{16}$O, in the InP crystal body and which undergoes $\beta^+$ decay with a half-life of 109.73 minutes. The InP crystal body having been irradiated with $^3$He is melted with an acid, and $^{18}$F generated by way of a $KBF_4$ (potassium tetrafluoroborate) precipitation method is chemically separated. Gamma rays of 511 keV, which are generated by positron annihilation upon the $\beta^+$ decay of $^{18}F$, are measured using a NaI detector to determine the number of counts for a specified time after the end of the irradiation by the least squares method. The number of counts after the specified time as determined using a standard sample, $SiO_2$, in the same manner is used for correction, thereby converting it to the oxygen concentration.

Moreover, a peak emission intensity (emission wavelength: around 1078 nm) of the oxygen defect centers in the InP crystal substrate is measured at a room temperature (25° C.) with the cathode luminescence (acceleration voltage: 5 kV; electron current: 0.4 nA; beam diameter: 10 nm), whereby an amount of the oxygen defect centers in the InP crystal substrate can be evaluated. When the amount of the oxygen defect centers is smaller than 500 counts/sec, the emission intensity of the oxygen defect centers in the InP crystal substrate is regarded as "Small". When the amount of the oxygen defect centers is larger than 5000 counts/sec, the emission intensity of the oxygen defect centers in the InP crystal substrate is regarded as "Large". When the amount of the oxygen defect centers is more than or equal to 500 counts/sec and less than or equal to 5000 counts/sec, the emission intensity of the oxygen defect centers in the InP crystal substrate is regarded as "Appropriate". When the emission intensity of the oxygen defect centers in the InP crystal substrate is not "Large" and "Small" but is "Appropriate", growth from the oxygen defect centers is facilitated during the crystal growth and therefore abnormal defects are less likely to be generated. "Small" is the second most preferable to "Appropriate". In the case of "Large", electron mobility in the InP single-crystal body becomes low, thus resulting in decreased characteristics of a device including the InP single-crystal substrate.

Example 2

An InP single-crystal body and an InP single-crystal substrate are produced in the same manner as in Example 1 except that the closure ratio of the closure plate is set to 90%, and the oxygen concentration thereof, the thickness of the oxide film thereof, the dislocation density thereof, and the emission intensity of the oxygen defect centers therein are measured. Results are collectively shown in Table 1.

Comparative Example 1

Production of an InP single-crystal body and an InP single-crystal substrate is attempted in the same manner as in Example 1 except that the closure ratio of the closure plate is set to 100%; however, the closure plate is caught in the crucible and the crucible is broken due to volume expansion resulting from crystal solidification, with the result that no excellent InP single-crystal body is obtained. Results are collectively shown in Table 1.

Comparative Example 2

An InP single-crystal body and an InP single-crystal substrate are produced in the same manner as in Example 1 except that the closure ratio of the closure plate is set to 80%, and the oxygen concentration thereof, the thickness of the oxide film thereof, the dislocation density thereof, and the emission intensity of the oxygen defect centers therein are measured. Results are collectively shown in Table 1.

Example 3

An InP single-crystal body and an InP single-crystal substrate are produced in the same manner as in Example 1 except that the closure ratio of the closure plate is set to 99%, and the oxygen concentration thereof, the thickness of the oxide film thereof, the dislocation density thereof, and the emission intensity of the oxygen defect centers therein are measured. Results are collectively shown in Table 1.

Comparative Example 3

An InP single-crystal body and an InP single-crystal substrate are produced in the same manner as in Example 1 except that two inter-heater gaps are provided, the closure ratio of the closure plate is set to 20%, and the temperature of the surface of the InP source material is set to 1070° C., and the oxygen concentration thereof, the thickness of the oxide film thereof, the dislocation density thereof, and the emission intensity of the oxygen defect centers therein are measured. Results are collectively shown in Table 1.

Comparative Example 4

An InP single-crystal body and an InP single-crystal substrate are produced in the same manner as in Example 1 except that four inter-heater gaps are provided and the closure ratio of the closure plate is set to 20%, and the oxygen concentration thereof, the thickness of the oxide film thereof, the dislocation density thereof, and the emission intensity of the oxygen defect centers therein are measured. Results are collectively shown in Table 1.

Comparative Example 5

An InP single-crystal body and an InP single-crystal substrate are produced in the same manner as in Example 1 except that four inter-heater gaps are provided and no closure plate is placed, and the oxygen concentration thereof, the thickness of the oxide film thereof, the dislocation density thereof, and the emission intensity of the oxygen defect centers therein are measured. Results are collectively shown in Table 1.

Example 4

An InP single-crystal body and an InP single-crystal substrate are produced in the same manner as in Example 1 except that the diameter of the InP single-crystal substrate is 125 mm, and the oxygen concentration thereof, the thickness of the oxide film thereof, the dislocation density thereof, and the emission intensity of the oxygen defect centers therein are measured. Results are collectively shown in Table 1.

Example 5

An InP single-crystal body and an InP single-crystal substrate are produced in the same manner as in Example 2 except that the diameter of the InP single-crystal substrate is 125 mm, and the oxygen concentration thereof, the thickness of the oxide film thereof, the dislocation density thereof, and the emission intensity of the oxygen defect centers therein are measured. Results are collectively shown in Table 1.

Example 6

An InP single-crystal body and an InP single-crystal substrate are produced in the same manner as in Example 1 except that the diameter of the InP single-crystal substrate is 150 mm, and the oxygen concentration thereof, the thickness of the oxide film thereof, the dislocation density thereof, and the emission intensity of the oxygen defect centers therein are measured. Results are collectively shown in Table 1.

Example 7

An InP single-crystal body and an InP single-crystal substrate are produced in the same manner as in Example 2 except that the diameter of the InP single-crystal substrate is 150 mm, and the oxygen concentration thereof, the thickness of the oxide film thereof, the dislocation density thereof, and the emission intensity of the oxygen defect centers therein are measured. Results are collectively shown in Table 1.

including an epitaxial layer grown on the substrate can be reduced. It should be noted that in view of a comparison among Example 1, Example 4, and Example 6, it was found that as the diameter of the InP single-crystal substrate becomes larger, the thickness of the oxide film and the dislocation density become larger.

In Comparative Example 1, one inter-heater gap was provided but the closure plate was placed at a closure ratio of 100%, with the result that the closure plate was caught in the crucible and the crucible was broken due to the volume expansion resulting from the crystal solidification as described above. Accordingly, no excellent InP single-crystal body was obtained. Moreover, in Comparative Example 2, the surface temperature of the InP source material was high and it was expected to suppress melt convection

TABLE 1

| | Example 1 | Example 2 | Comparative Example 1 | Comparative Example 2 | Example 3 | Comparative Example 3 | Comparative Example 4 | Comparative Example 5 | Example 4 | Example 5 | Example 6 | Example 7 |
|---|---|---|---|---|---|---|---|---|---|---|---|---|
| Closure Ratio of Closure Plate (%) | 97 | 90 | 100 | 80 | 99 | 20 | 20 | 0 | 97 | 90 | 97 | 90 |
| Number of Inter-Heater Gaps | 1 | 1 | 1 | 1 | 1 | 2 | 4 | 4 | 1 | 1 | 1 | 1 |
| Diameter of InP Single-Crystal Substrate (mm) | 100 | 100 | 100 | 100 | 100 | 100 | 100 | 100 | 125 | 125 | 150 | 150 |
| Oxygen Concentration of InP Single-Crystal Substrate (atoms·cm$^{-3}$) | $5.50 \times 10^{15}$ | $9.50 \times 10^{15}$ | — | $2.80 \times 10^{16}$ | $1.00 \times 10^{15}$ | $3.25 \times 10^{16}$ | $5.55 \times 10^{16}$ | $8.87 \times 10^{16}$ | $7.50 \times 10^{15}$ | $8.50 \times 10^{15}$ | $9.10 \times 10^{15}$ | $9.80 \times 10^{15}$ |
| Thickness of Oxide Film of InP Single-Crystal Substrate (nm) | 0.34 | 0.95 | — | 1.20 | 0.15 | 1.51 | 1.83 | 2.11 | 0.80 | 0.96 | 0.90 | 0.98 |
| Dislocation Density (cm$^{-2}$) | 2500 | 2500 | — | 2500 | 2500 | 4000 | 2500 | 2500 | 3000 | 3000 | 3500 | 3500 |
| Emission Intensity of Oxygen Defect Centers | Appropriate | Appropriate | — | Large | Small | Large | Large | Large | Appropriate | Appropriate | Appropriate | Appropriate |

With reference to Table 1, as shown in Example 1 to Example 7, the oxygen concentration could be reduced to less than $1 \times 10^{16}$ atoms·cm$^{-3}$ in each of the InP single-crystal bodies and the InP single-crystal substrates produced with one inter-heater gap being provided and the closure plate being placed at a closure ratio of 90% to 99%. Moreover, in each of these InP single-crystal substrates, the thickness of the oxide film of the main surface thereof could be as thin as 0.15 nm to 0.98 nm, the dislocation density could be also as low as 2500 cm$^{-2}$ to 3500 cm$^{-2}$, and the emission intensity of the oxygen defect centers in the substrate could be appropriate (suitable), not large or small. Since the oxygen concentration is so low as to be less than $1 \times 10^{16}$ atoms·cm$^{-3}$, the thickness of the oxide film of the main surface is as thin as 0.15 nm to 0.98 nm, and the emission intensity of the oxygen defect centers in the crystal is not too large or too small but is appropriate (suitable) in each of these InP single-crystal substrates, a composite state can be suppressed from being formed in the substrate, a response speed as a semiconductor device can be suppressed from being reduced, and resistance of a semiconductor device currents; however, the oxygen concentration of each of the InP single-crystal body and the InP single-crystal substrate could not be less than $1 \times 10^{16}$ atoms·cm$^{-3}$ and the dislocation density thereof became high. Moreover, in each of Comparative Example 3 and Comparative Example 4, two or four inter-heater gaps were provided and the closure plate being placed at a closure ratio of 20%; however, the oxygen concentration of each of the InP single-crystal body and the InP single-crystal substrate could not be less than $1 \times 10^{16}$ atoms·cm$^{-3}$. Moreover, in Comparative Example 5, the typical conditions in which four inter-heater gaps were provided and no closure plate was placed were employed, with the result that the oxygen concentration of each of the InP single-crystal body and the InP single-crystal substrate became high.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

11: InP seed crystal; 13: InP source material; 20, 30: manufacturing apparatus; 21, 31: crucible; 21c, 31c: oxide film; 22, 32: crucible holder; 23, 33: sealing member; 24a, 24b, 34a, 34b, 34c, 34d: heater; 24abo, 34abo, 34bco, 34cdo: inter-heater gap; 25: closure plate; 25o: opening; 26, 36: chamber.

The invention claimed is:

1. An indium phosphide single-crystal body having an oxygen concentration of more than or equal to $8.5 \times 10^{15}$ atoms cm$^{-3}$ and less than $1 \times 10^{16}$ atoms cm$^{-3}$,
the indium phosphide single-crystal body comprising a straight body portion having a cylindrical shape, wherein a diameter of the straight body portion is more than or equal to 125 mm and less than or equal to 150 mm, and
wherein a dislocation density of the indium phosphide single-crystal body is less than or equal to 3500 cm$^{-2}$.

2. The indium phosphide single-crystal body according to claim 1, wherein the dislocation density of the indium phosphide single-crystal body is more than or equal to 2500 cm$^{-2}$ and less than or equal to 3500 cm$^{-2}$.

3. The indium phosphide single-crystal body according to claim 1, wherein an amount of oxygen defect centers in the indium phosphide single-crystal body is more than or equal to 500 counts/sec and less than or equal to 5000 counts/sec.

4. An indium phosphide single-crystal substrate having an oxygen concentration of more than or equal to $8.5 \times 10^{15}$ atoms cm$^{-3}$ and less than $1 \times 10^{16}$ atoms cm$^{-3}$, wherein a diameter of the indium phosphide single-crystal substrate is more than or equal to 125 mm and less than or equal to 150 mm, and
wherein a dislocation density of the indium phosphide single-crystal substrate is less than or equal to 3500 cm$^{-2}$.

5. The indium phosphide single-crystal substrate according to claim 4, wherein the dislocation density of the indium phosphide single-crystal substrate is more than or equal to 2500 cm$^{-2}$ and less than or equal to 3500 cm$^{-2}$.

6. The indium phosphide single-crystal substrate according to claim 4, wherein an amount of oxygen defect centers in the indium phosphide single-crystal substrate is more than or equal to 500 counts/sec and less than or equal to 5000 counts/sec.

* * * * *